(12) United States Patent
Doni

(10) Patent No.: US 8,262,845 B2
(45) Date of Patent: Sep. 11, 2012

(54) PROCESSING SYSTEMS AND METHODS FOR SEMICONDUCTOR DEVICES

(75) Inventor: Lothar Doni, Villach (AT)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 12/917,651

(22) Filed: Nov. 2, 2010

(65) Prior Publication Data

US 2011/0042005 A1 Feb. 24, 2011

Related U.S. Application Data

(62) Division of application No. 11/595,446, filed on Nov. 9, 2006, now Pat. No. 7,851,373.

(51) Int. Cl.
*H01L 21/465* (2006.01)
(52) U.S. Cl. .................................. 156/345.15
(58) Field of Classification Search .............. 156/345.11, 156/345, 345.15
See application file for complete search history.

(56) References Cited

U.S. PATENT DOCUMENTS

| | | | |
|---|---|---|---|
| 5,641,383 A | 6/1997 | Jun | |
| 5,834,349 A | 11/1998 | Tseng | |
| 6,000,997 A | 12/1999 | Kao et al. | |
| 6,584,989 B2 | 7/2003 | Taft et al. | |
| 6,613,693 B1 | 9/2003 | Heo et al. | |
| 6,624,082 B2 | 9/2003 | Luo et al. | |
| 6,758,940 B2 * | 7/2004 | Chiu | 156/345.15 |
| 6,780,277 B2 * | 8/2004 | Yokomizo et al. | 156/345.11 |
| 6,957,749 B2 * | 10/2005 | Achkire et al. | 222/3 |
| 2011/0042005 A1 * | 2/2011 | Doni | 156/345.15 |

FOREIGN PATENT DOCUMENTS

JP 10-83981 3/1998

OTHER PUBLICATIONS

"Vertical laminar flow rinse tank," RD 284034, Dec. 1987, 2 pages, Kenneth Mason Publications Ltd.
"ET Series, Etch-Tech™ Fluoropolymer Cascading Process Bath," http://www.process-technology.com/processtechnol/etchtech05.pdf, downloaded Oct. 12, 2006, 2 pp., Process Technology, Mentor, OH.
Wolf, S., et al., "Silicon Processing for the VLSI Era: vol. 1: Process Technology," 2nd Ed., 2000, 4 pages, Lattice Press, Sunset Beach, CA.

* cited by examiner

*Primary Examiner* — Sylvia R. MacArthur
(74) *Attorney, Agent, or Firm* — Slater & Matsil, L.L.P.

(57) ABSTRACT

Systems and methods for processing semiconductor devices are disclosed. A preferred embodiment comprises a processing system that includes providing a processing system including a first container and a second container fluidly coupled to the first container, the second container being adapted to receive and retain an overflow amount of a fluid from the first container, and disposing the fluid in the first container and a portion of the second container. The method includes providing at least one semiconductor device, disposing the at least one semiconductor device in the first container, and maintaining the fluid in the second container substantially to a first level while processing the at least one semiconductor device with the fluid.

22 Claims, 5 Drawing Sheets

PROCESSING SYSTEMS AND METHODS FOR SEMICONDUCTOR DEVICES

This application is a divisional of patent application Ser. No. 11/595,446, entitled "Processing Systems and Methods for Semiconductor Devices," filed on Nov. 9, 2006 now U.S. Pat. No. 7,851,373, which application is incorporated herein by reference.

TECHNICAL FIELD

The present invention relates generally to semiconductor devices, and more particularly to processing systems and methods used in the manufacturing of semiconductor devices.

BACKGROUND

Generally, semiconductor devices are used in a variety of electronic applications, such as computers, cellular phones, personal computing devices, and many other applications. Home, industrial, and automotive devices that in the past comprised only mechanical components now have electronic parts that require semiconductor devices, for example.

Semiconductor devices are manufactured by depositing many different types of material layers over a semiconductor workpiece, wafer, or substrate, and patterning the various material layers using lithography. The material layers typically comprise thin films of conductive, semiconductive, and insulating materials that are patterned and etched using lithography to form integrated circuits (ICs). There may be a plurality of transistors, memory devices, switches, conductive lines, diodes, capacitors, logic circuits, and other electronic components formed on a single die or chip, for example.

Lithography is a process in which a layer of photosensitive material is deposited over a material layer, and the layer of photosensitive material is patterned by exposing the layer of photosensitive material to energy through a lithography mask. The layer of photosensitive material is then developed, and the layer of photosensitive material is used as a mask while exposed portions of the material layer are etched away.

Dry etch techniques such as physical sputtering, ion beam milling, reactive ion etch (RIE), and plasma etch processes are often used to pattern material layers of semiconductor devices, for example. However, some material layers in semiconductor devices, such as nitride layers, as an example, are often etched or removed using wet etch processes.

In a wet etch process, typically a semiconductor wafer or batch of semiconductor wafers are submerged in an etching liquid during an etch process. However, in some applications and with some wet etch chemistries, it can be difficult to control the etch rate.

Thus, what are needed in the art are improved wet etch processes and processing systems.

SUMMARY OF THE INVENTION

These and other problems are generally solved or circumvented, and technical advantages are generally achieved, by preferred embodiments of the present invention, which provide novel processing systems and methods for semiconductor devices.

In accordance with a preferred embodiment of the present invention, a processing system includes providing a processing system including a first container and a second container fluidly coupled to the first container, the second container being adapted to receive and retain an overflow amount of a fluid from the first container. The fluid is disposed in the first container and a portion of the second container. At least one semiconductor device is provided, and the at least one semiconductor device is disposed in the first container. The fluid in the second container is maintained substantially to a first level while processing the at least one semiconductor device with the fluid.

The foregoing has outlined rather broadly the features and technical advantages of embodiments of the present invention in order that the detailed description of the invention that follows may be better understood. Additional features and advantages of embodiments of the invention will be described hereinafter, which form the subject of the claims of the invention. It should be appreciated by those skilled in the art that the conception and specific embodiments disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in the different figures generally refer to corresponding parts unless otherwise

DETAILED DESCRIPTION OF ILLUSTRATIVE EMBODIMENTS

Figure 1:
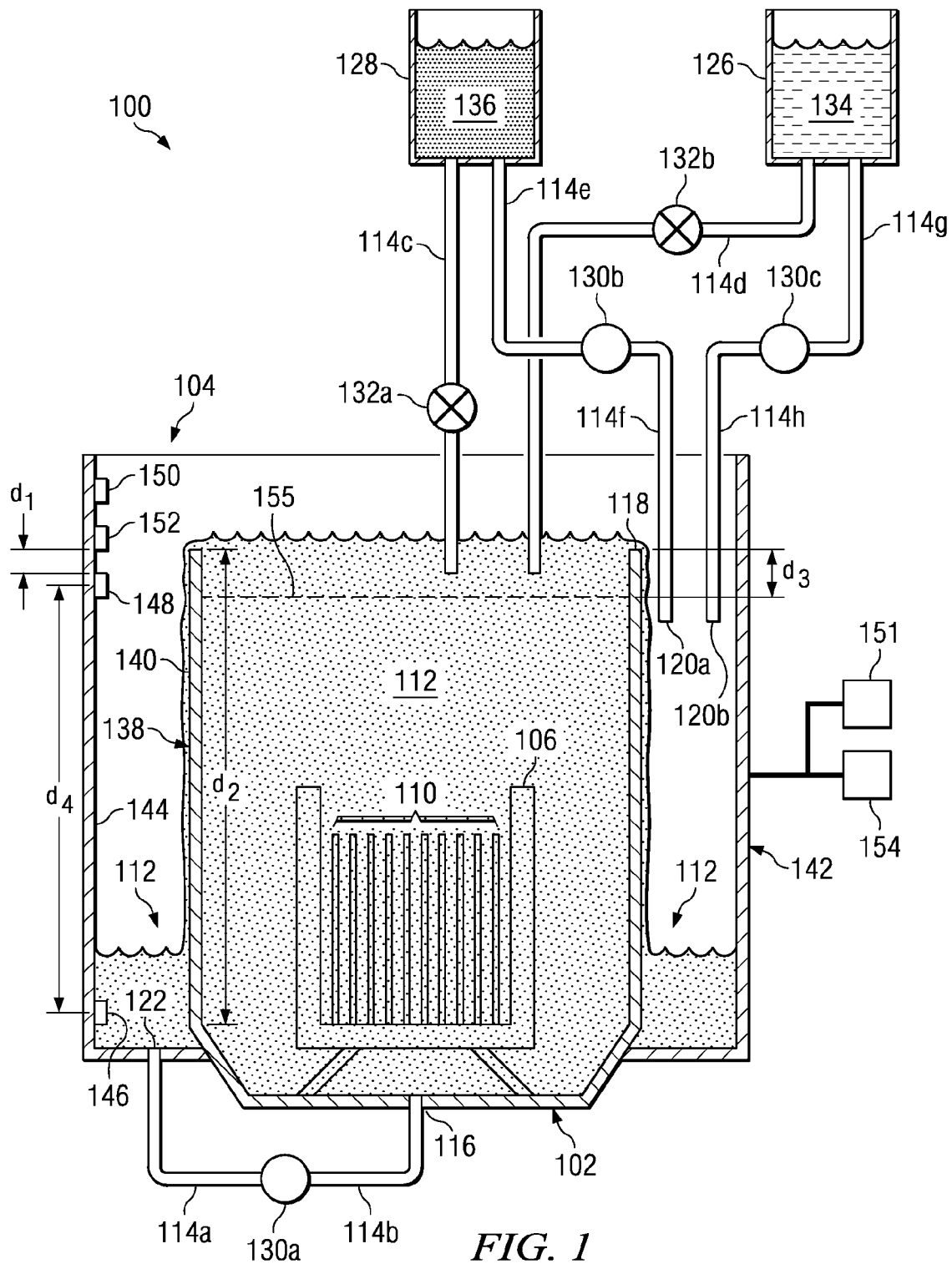
FIG. 1 shows a system for processing semiconductor devices in accordance with a preferred embodiment of the present invention that includes a fluid container and a weir disposed proximate at least a portion of a perimeter of the fluid container.

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, namely implemented in processing tanks where a phosphoric acid ($H_3PO_4$) solution is used as a wet etching fluid to pattern or remove nitride material layers, such as layers of silicon nitride ($Si_xN_y$). Embodiments of the present invention may also be applied, however, to other wet etch processing systems and systems used to pattern, remove, or affect other types of material layers using other chemistries and etching solutions, for example.

$H_3PO_4$ etch processes are used in some semiconductor applications, e.g., in state of the art technologies, such as in a 65 nm node architecture, as an example, in order to remove nitride layers. In $H_3PO_4$ etch processes, semiconductor wafers are submerged in a solution of $H_3PO_4$ and deionized water in recirculated tanks. However, nitride etch rates processed in $H_3PO_4$ tanks tend to show large variations in the etch rate over the bath lifetime. Maintaining a constant etch rate in an $H_3PO_4$ process is challenging. The concentration of $H_3PO_4$ in an etching fluid affects the etch rate: a high concentration of $H_3PO_4$ leads to a low etch rate, and a low concentration of $H_3PO_4$ results in a higher etch rate. Because the deionized water and/or the $H_3PO_4$ in the etching solution tend to evaporate over time, which changes the $H_3PO_4$ concentration, deionized water is typically "spiked" or added into the tank on a periodic basis or when the etch rate is observed to become too high in order to maintain a constant concentration. However, adding deionized water to the bath requires complicated tool software and causes a difficult start up of the tool.

Changes in the etch rate of $H_3PO_4$ solutions over time result in variations in material thicknesses and etch times from lot to lot of semiconductor wafers, which is undesirable. Thus, what are needed are methods of maintaining a stable concentration of $H_3PO_4$ in $H_3PO_4$ etching solutions, fluids, and systems.

Embodiments of the present invention achieve technical advantages by stabilizing the nitride etch rate in a recirculated hot $H_3PO_4$ bath. The fluid level in a weir or overflow tank is retained at a constant level, so that the exposed surfaces from which deionized water and $H_3PO_4$ evaporate are kept at constant dimensions, resulting in a constant etch rate.

Embodiments of the invention may be implemented in a recirculated hot $H_3PO_4$ bath type of etching system. Embodiments of the present invention may also be implemented in fluid processing systems that utilize other types of etching fluids and processing fluids, for example. The systems and methods described herein are implementable in hardware and/or software of a processing system or tool, for example.

With reference now to FIG. 1, there is shown a system 100 for processing semiconductor devices 110 in accordance with a preferred embodiment of the present invention. The system 100 is also referred to herein as a processing system or an etching system herein. The system 100 may also be referred to as a wet bench, for example.

The processing system 100 includes a fluid container 102 and a weir 104 disposed proximate at least a portion of a perimeter of the fluid container 102. The container 102 is also referred to as a first container herein, and the weir 104 is also referred to as a second container herein, for example. The container 102 is preferably disposed within the weir 104, as shown. The container 102 and the weir 104 comprise tanks adapted to hold a fluid 112. The container 102 may have a lower portion that slopes inwardly towards the bottom, for example. The container 102 and the weir 104 are preferably square or rectangular in a top view, although alternatively, the container 102 and weir 104 may comprise other shapes, such as round or elliptical, as examples. The container 102 may be larger than the weir 104; for example, the container 102 may be adapted to hold about 30 to 50 liters of a fluid 112, and the weir 104 may be adapted to hold about 5 liters or less of a fluid 112, although alternatively, the container 102 and weir 104 may comprise other sizes. The processing system 100 may include a lid that covers the top of both the container 102 and the weir 104, for example, not shown.

A support 106 for semiconductor devices 110, also referred to herein as semiconductor wafers 110, may be loaded with one or more semiconductor devices 110 and may be placed in the container 102 for processing in the fluid 112, as shown. The support 106 may comprise a cartridge or carrier, for example, and may comprise legs or feet adapted to contact the bottom of the container 102, as shown. The support 106 may comprise ridges, recesses, or other shapes adapted to support and retain one or more semiconductor wafers 110 during the processing of the semiconductor wafers 110 in the container 102, for example.

The fluid 112 preferably comprises an etch solution in some embodiments, although alternatively, the fluid 112 may comprise other fluids that may be used to process the semiconductor devices 110, e.g., that may alter or affect the semiconductor device 110, for example. In a preferred embodiment, the fluid 112 comprises a solution of $H_3PO_4$ and deionized water. In some embodiments, the fluid 112 preferably comprises a concentration of about 87 to 90% by weight of $H_3PO_4$ (at a predetermined processing temperature) and about 13 to 10% by weight of deionized water, as an example, although alternatively, other concentrations of $H_3PO_4$ and deionized water may also be used.

The fluid 112 is recirculated from the container 102 into the weir 104, then from an output port 122 of the weir 104 through a pipe 114a coupled to the weir 104 to a pump 130a, then through a pipe 114b coupled to the pump 130a back to an input port 116 in a lower region, e.g., the bottom, of the container 102, as shown. Thus, the pump 130a recirculates the fluid 112 from the weir 104 to the container 102 while the semiconductor devices 110 are processed in the container 102.

Additional fluid 112 may be added to the container 102 and/or the weir 104 from a tank 126 containing a supply of a first fluid 134 and a tank 128 containing a supply of a second fluid 136, for example. The first fluid 134 may comprise deionized water and the second fluid 136 may comprise $H_3PO_4$ in one embodiment, as examples, although alternatively, the first fluid 134 and the second fluid 136 may comprise other fluids. The first fluid 134 and the second fluid 136 preferably comprise components of the solution of the fluid 112, for example.

At least one of the fluids 134 or 136 may be continuously added to the fluid 112, e.g., into the weir 104 and/or the container 102, during the etch process. For example, if the first fluid 134 comprises deionized water, the first fluid 134 may be added to the fluid 112 during an etch process at a constant rate of about 60 mL/min, in order to maintain a stable concentration of the first fluid 134 and the second fluid 136 in the fluid 112. However, advantageously, in accordance with embodiments of the present invention, the first fluid 134 may not need to be added to the fluid 112 during an etch process, to be described further herein.

Tank 128 may be coupled to the container 102 by a pipe 114c coupled to a valve 132a which is coupled to another pipe that enters into the container 102. Tank 126 may be coupled by a pipe 114d to a valve 132b which is coupled to another pipe that enters into the container 102. Likewise, tank 128 may also be coupled by a pipe 114e to a pump 130b that is coupled to another pipe 114f that enters into the weir 104 at an input port 120a to the weir 104, and tank 126 may be coupled by a pipe 114g to a pump 130c that is coupled to another pipe 114h that enters into the weir 104 at an input port 120b to the weir 104, as shown. Valves 132a and 132b or pumps 130a, 130b, and 130c may be used to supply the fluids 134 and 136, depending on the location of the tanks 126 and 128 relative to the container 102 and weir 104; for example, if the tanks 126 and 128 are positioned higher than the container 102 and weir 104, then a pump 130a, 130b, and 130c may not be required, and a valve 132a and 132b may be used, utilizing gravity for the movement of the fluids 112, 134, and 136.

The tanks 126 and 128, pumps 130a, 130b, and 130c, valves 132a and 132b, and pipes 114a, 114b, 114c, 114d, 114e, 114f, 114g, and 114h may comprise a fluid delivery means, for example, coupled to the container 102 and/or the weir 104 that is adapted to increase or decrease the amount of fluid 112 in the container 102 and/or the weir 104, and to also alter the concentrations of the first fluid 134 and/or the second fluid 136 in the fluid 112 which comprises a solution of the first fluid 134 and the second fluid 136, for example.

The weir 104 is adapted to receive and retain an overflow amount of a fluid 112 from the container 102. For example, the container 102 may comprise sidewalls 138 and a top edge 118. The sidewalls 138 are also referred to herein as a first vertical portion of the container 102 or first container. The weir 104 may comprise sidewalls 142 having a height that is greater than a height of the top edge 118 of the container 102. The sidewalls 142 are also referred to herein as a second vertical portion of the weir 104 or second container. The first vertical portion 138 of the first container 102 comprises a top edge 118 that is lower than a top edge of the second vertical portion 142 of the second container 104. The weir 103 contains the fluid 112 within the inner edge 144 of sidewalls 142 and within the outer edge 140 of sidewalls 138, for example.

Thus, the second container 104 or weir is fluidly coupled to the first container 102 by the first vertical portion 138 of the first container 102. If the level of the fluid 112 in the container 102 exceeds the top edge 118 of the sidewalls 138 of the container 102, the fluid 112 flows over the top edge 118 and along the sidewalls 138 of the container 102 into the weir 104, so that the fluid 112 covers the outer edge 140 of sidewalls 138.

The processing system 100 may include a heater (not shown) coupled to the fluid 112, 134, or 136, e.g., in the container 102, in the weir 104, coupled to a pipe 114a, 114b, 114c, 114d, 114e, 114f, 114g, and 114h, and/or in the tanks 126 or 128. Preferably, during processing of semiconductor devices 110, the temperature of the fluid 112 is maintained at about 155 to 165 degrees C.; e.g., in an embodiment wherein the fluid 112 comprises a solution of $H_3PO_4$ and deionized water, although alternatively, other temperatures may also be used. The temperature of the fluid 112 may be maintained at a temperature of about 180 degrees C. or less in some embodiments, for example. The processing system 100 may also comprise a thermostat (also not shown) for monitoring and controlling the temperature of the fluid 112, for example, not shown. The processing system 100 may also comprise one or more filters (not shown) coupled within or to the fluid delivery means, to filter the fluids 112, 134, or 136, for example.

The processing system 100 may include a minimum level sensor 146 disposed proximate a lower region of the weir 104, a full sensor 148 disposed proximate a top edge of the container 102 within the weir 104, and an alarm sensor 150 disposed proximate the top edge of the sidewall 142 of the weir 104, as shown. In accordance with an embodiment of the present invention, an additional sensor 152 may be disposed above the full sensor 148, for example. The additional sensor 152 may comprise an overfull sensor 152, for example, to be described further herein. One or more of the sensors 146, 148, 150, or 152 may comprise a controller disposed in the second container or weir 104, wherein the controller 146, 148, 150, or 152 is adapted to maintain the fluid 112 to a substantially constant level in the second container 104 while at least one semiconductor device and the fluid are contained within the first container. The controller 146, 148, 150, or 152 comprises at least one sensor 146, 148, 150, or 152 disposed proximate the level of the substantially constant level in the second container or weir 104, for example.

The processing system 100 may also include a processor 151 that may comprise a computer, as an example, and also may include software 154 that may comprise code stored in a memory or other storage means, for example. Embodiments of the present invention may comprise instructions in the software 154 that are implementable, e.g., communicated to the various components of the system 100 by the processor 151, for example.

There are several factors that influence the concentration of the fluids 134 and 136 in the fluid 112, which in turn influences the etch rate of the fluid 112. Factors that influence the concentration include the temperature, the pressure, and the amount of fluids 134 and 136 added to the fluid 112, as examples.

A heretofore unknown factor that further influences the concentration of the fluid 112 is the level of the fluid 112 in the weir 104. In accordance with preferred embodiments of the present invention, the level of the fluid 112 in the weir 104 is maintained at substantially the same predetermined level over time during an etch process, in order to maintain a substantially constant concentration of the fluids 134 and 136 in the fluid 112, resulting in a substantially constant etch rate, to be described further herein. For example, in some embodiments, the level of the fluid 112 in the weir 104 is preferably maintained at or between sensors 148 and 152, e.g., at a level substantially within a range represented by dimension $d_1$ in FIG. 1. In other embodiments, the level of the fluid 112 in the weir 104 is maintained substantially at the level of the full sensor 148, for example.

Figure 2:
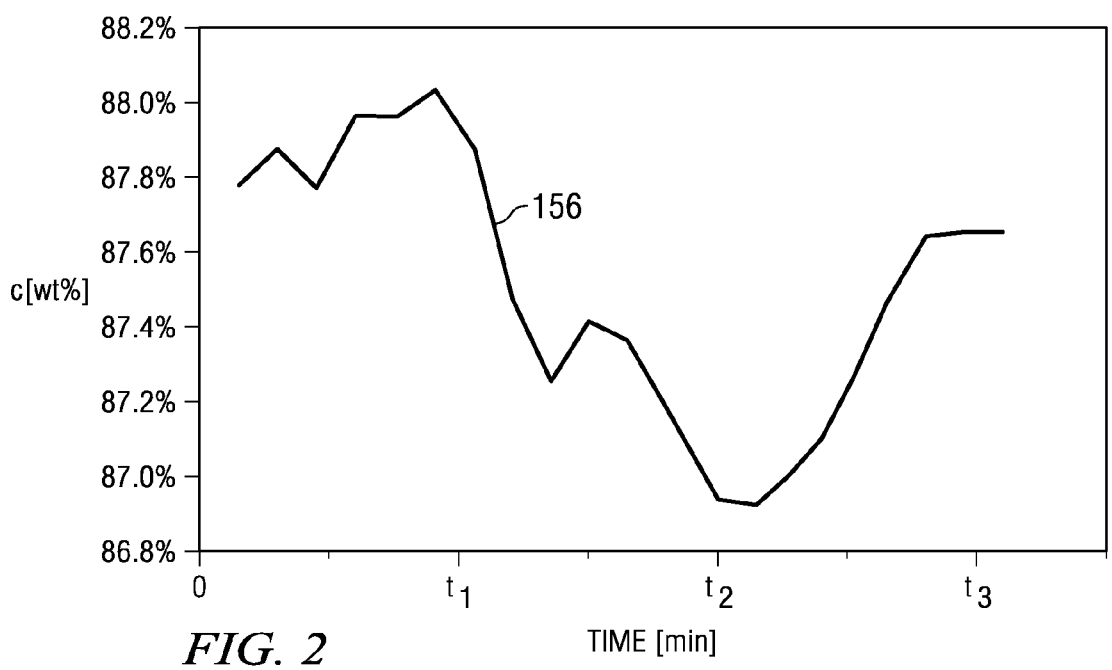
FIG. 2 is a graph illustrating concentration fluctuations of the fluid that may be caused by fluctuations in the fluid level in the weir.

The phenomenon of the fluid 112 level in the weir 104 affecting the concentration of the fluids 134 and 136 that are components of the solution of the fluid 112 will next be described. FIG. 2 is a graph 156 illustrating experimental results of concentration fluctuations of components of a fluid 112 caused by fluctuations in the fluid 112 level in a weir 104 where the fluid 112 comprised a solution of $H_3PO_4$ and deionized water. Some concentration variations are observable in the graph 156, the root cause for which was the changing of the fluid 112 level in the weir 104, I discovered.

Referring again to FIG. 1, due to boiling and/or evaporation (e.g., during heating) of the fluid 112 and due to removal of a portion of the fluid 112 when wafers 110 are removed to transfer them to a rinse tank (not shown) which may decrease the fluid 112 level to 155 or other levels, for example, there may be a steady decrease of the fluid 112 level over the bath lifetime. Each time the carrier 106 supporting semiconductor devices 110 is removed from the container 102, about ½ to 1 liter of the fluid 112 is removed, for example. The level of the fluid 112 in the container 102 is typically full during an etch process, e.g., filling the entire dimension $d_2$ of the vertical portion of the container 102, and the level in the container 102 may drop down by a dimension $d_3$ when the wafers 110 are removed, for example. The level of the fluid 112 in the weir 104 increases when additional wafers 110 are added to the container 102, and the container 102 is then refilled with the fluid 112 from the weir 104. Thus, the level of the fluid 112 in the weir 104 decreases or drops down over time as batches of devices 110 are processed.

The graph 156 in FIG. 2 illustrates concentration changes that occurred when the minimum sensor 146 signal was lost. At that time, e.g., at time $t_1$, the concentration (c) by percentage of weight of $H_3PO_4$ in the fluid 112 was about 88.0%. When the system 100 detected that the level of the fluid 112 had dropped below the minimum sensor 146 level, the system 100 refilled the weir 104 up to the full sensor 148, e.g., with fluid 112 from tanks 134 and 136, increasing the level of the fluid 112 in the weir 104 by a dimension $d_4$ along a sidewall 142 of the weir 104. The concentration by percentage of weight of $H_3PO_4$ in the fluid 112 decreased after the level of the fluid 112 was increased in the weir 104 from time $t_1$ to time $t_2$ to less than 87.0%. The weir 104 was then drained to lower the fluid 112 level in the weir 104, resulting in an increase in the concentration of $H_3PO_4$ in the fluid 112 to about 87.6%, as shown at time $t_3$ in graph 156. The concentration changes shown in graph 156 correlate with the changes made to the fluid 112 level in the weir 104. Note that in the experimental results shown in FIG. 2, fluid 134 was introduced at a constant rate to the fluid 112 in the weir 104; e.g., the deionized water "spiking" rate was held constant during the experiment.

Figure 3:
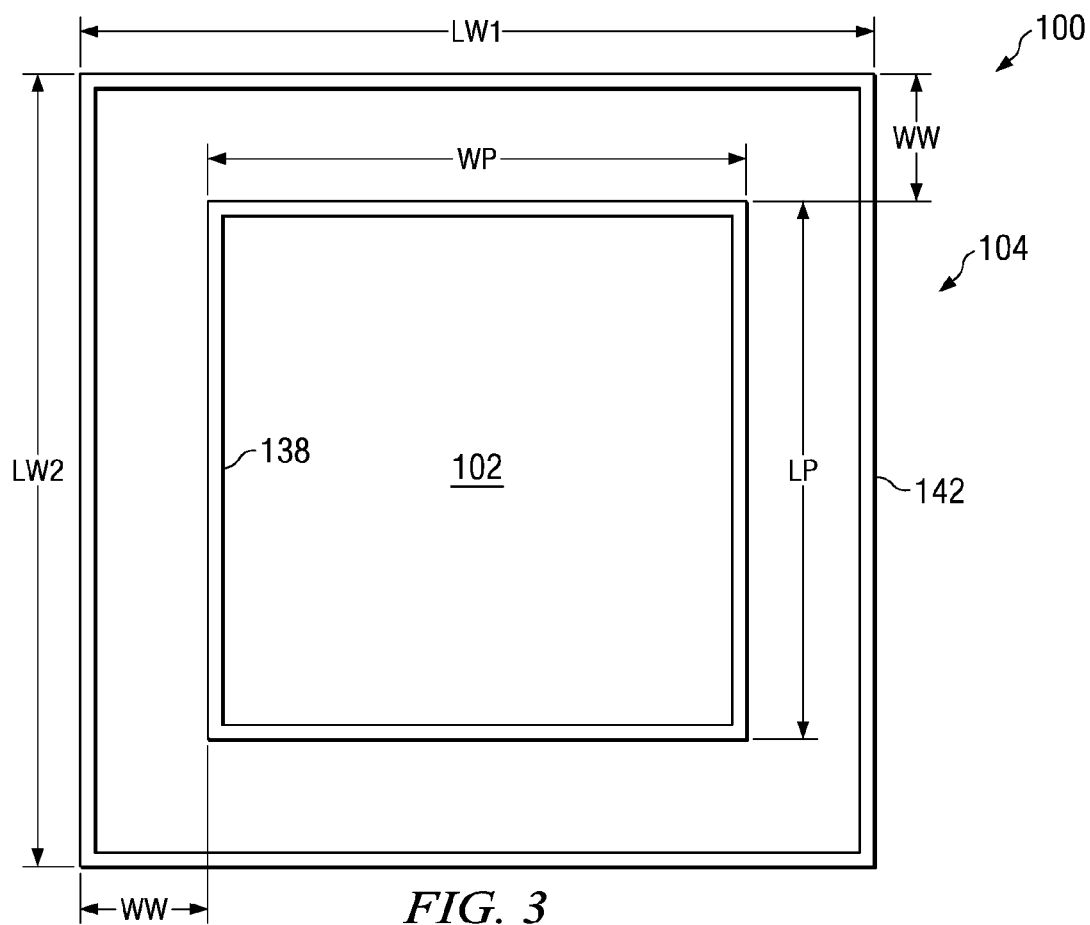
FIG. 3 is a top view of the fluid container and the weir shown in FIG. 1.
Figure 4:
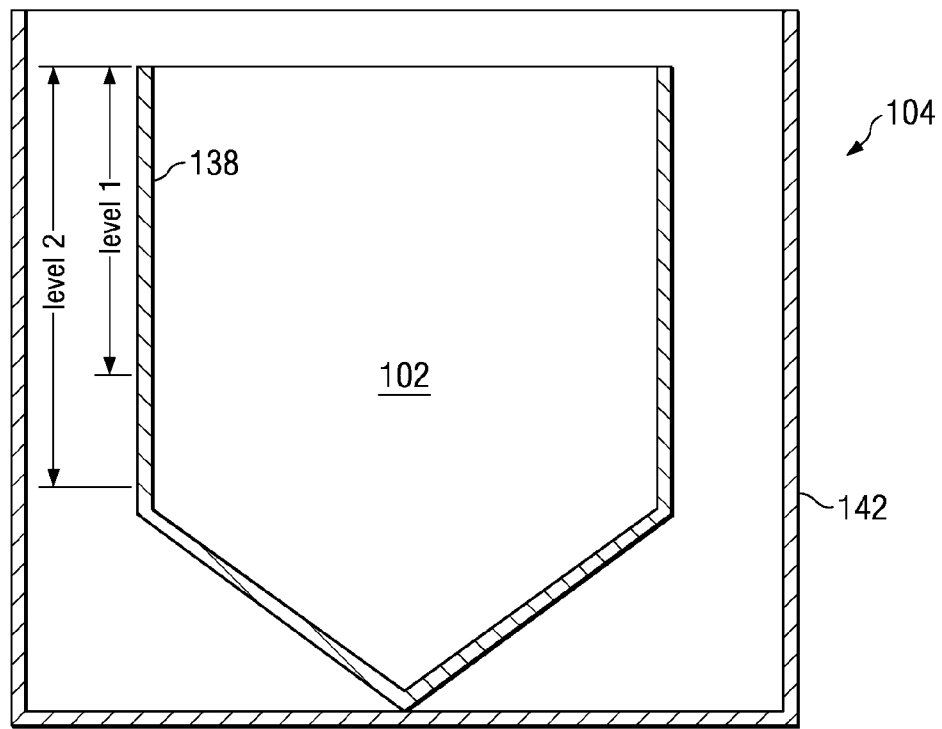
FIG. 4 shows a side view of the fluid container and the weir, illustrating some dimensions within the weir.

Fluid 112 level variations in the weir 104 result in a change in the size of the fluid 112 surface areas. FIGS. 3 and 4 illustrate some dimensions of the fluid container 102 and the weir 104. FIG. 3 is a top view of the fluid container 102 and the weir 104 shown in FIG. 1, and FIG. 4 shows a side view of the fluid container 102 and the weir 104.

In the experimental results shown in the graph 156 of FIG. 2, the processing system 100 (see FIG. 3) comprised a first container 102 comprising a width WP of 24.8 cm and a length LP of 42 cm. The processing system 100 comprised a second container or weir 104 comprising a width WW of 4.8 cm (e.g., the distance between the sidewalls 138 of the container 102 and the sidewalls 142 of the weir 104), a length LW2 along one side of 51.6 cm, and a length LW1 along another side of 34.4 cm.

The surface area of the fluid 112 in the processing system 100 comprised two components: the horizontal surface area and the vertical surface area. The horizontal surface area may be calculated by summing the surface area of the container 102 and the surface area of the weir 104, as shown in Eq. 1:

$$\text{horizontal surface area} = (LP*WP) + (2*WP*WW) + (2*LW2*WW) \qquad \text{Eq. 1:}$$

which results in a horizontal surface of 1,775 cm² for the example shown in FIG. 2.

The vertical surface area component results from the fluid 112 flowing down the sidewalls 138 out of the container 102 into the weir 104, thus creating an additional surface. The surface area of this vertical surface depends strongly on the level of the fluid 112 in the weir 104. For example, in FIG. 4, which shows a side view of the fluid container 102 and the weir 104, a first level, "level 1" and a second level, "level 2" are shown, wherein level 2 is greater than level 1. The vertical surface area may be calculated using Equation 2:

$$\text{vertical surface area} = (2*LP*\text{level } X) + (2*WP*\text{level } X); \qquad \text{Eq. 2:}$$

wherein level X=level 1 or level 2.

In the experimental results previously described with reference to FIG. 2, the dimension level 1 was about 6 cm, and the dimension level 2 was about 22.5 cm: therefore, the vertical surface area calculated using level 1 and Eq. 2 is 802 cm², whereas the vertical surface area calculated using level 2 and Eq. 2 is 3,006 cm². Thus, this demonstrates that the vertical surface area has a large impact on the overall surface area of the fluid 112.

If the fluid 112 level decreases in the weir 104, then the vertical surface area increases, which increases the rate of evaporation of the acid (e.g., fluid 136) and deionized water (e.g., fluid 134) in the fluid 112, for example. Thus, in accordance with embodiments of the present invention, the fluid 112 level is preferably advantageously kept constant in the weir 104 during an etch process. This is achieved in some embodiments by maintaining the level of the fluid 112 in the weir 104 at a constant level, e.g., using an existing sensor, such as a full sensor 148 within the weir 104, and by modifying software 154 (see FIG. 1) of the processing system 100 to include instructions for the processor 151 to instruct other components of the system 100 to refill the weir 104 when the full sensor 148 signal is lost. The full sensor 148 signal may be observed more frequently, e.g., the time periods between checking the full sensor 148 signal may be decreased, in this embodiment.

The fluid 112 is preferably maintained at a relatively high level within the weir 104 in some embodiments while processing semiconductor devices 110, e.g., the fluid 112 is preferably maintained at a level at over half to ⅔ full, in order to decrease the amount of evaporation of the components 134 and 136 of the fluid 112, by minimizing the vertical surface area of the fluid 112 flowing from the container 102 into the weir 104, as an example.

In other embodiments of the present invention, an additional sensor 152 may be used for maintaining the fluid 112 in the weir 104 at a constant level. For example, an overfull sensor 152 may be included in the weir 104 disposed above the full sensor 148 specifically for the purpose of maintaining the weir fluid 112 level. Each time the fluid 112 level drops below the full sensor 148, the fluid 112 in the weir 104 is refilled until the full sensor 148 is reached again. In this embodiment, when the fluid 112 level rises and is detected by the overfull sensor 152, which may occur when only a few wafers 110 are processed over a period of time, because the deionized water (e.g., fluid 134 in FIG. 1) continues to be added to the fluid 112 during the processing of the semiconductor devices 110, the level of the overfull sensor 152 may be reached. Instructions are preferably included in the software 154 of the processing system 100 to instruct the weir 104 to be drained or for fluid 112 to be removed from the weir 104 until the fluid 112 level within the weir 104 is decreased below the overfull sensor 152 level, for example, in this embodiment.

Figure 5:
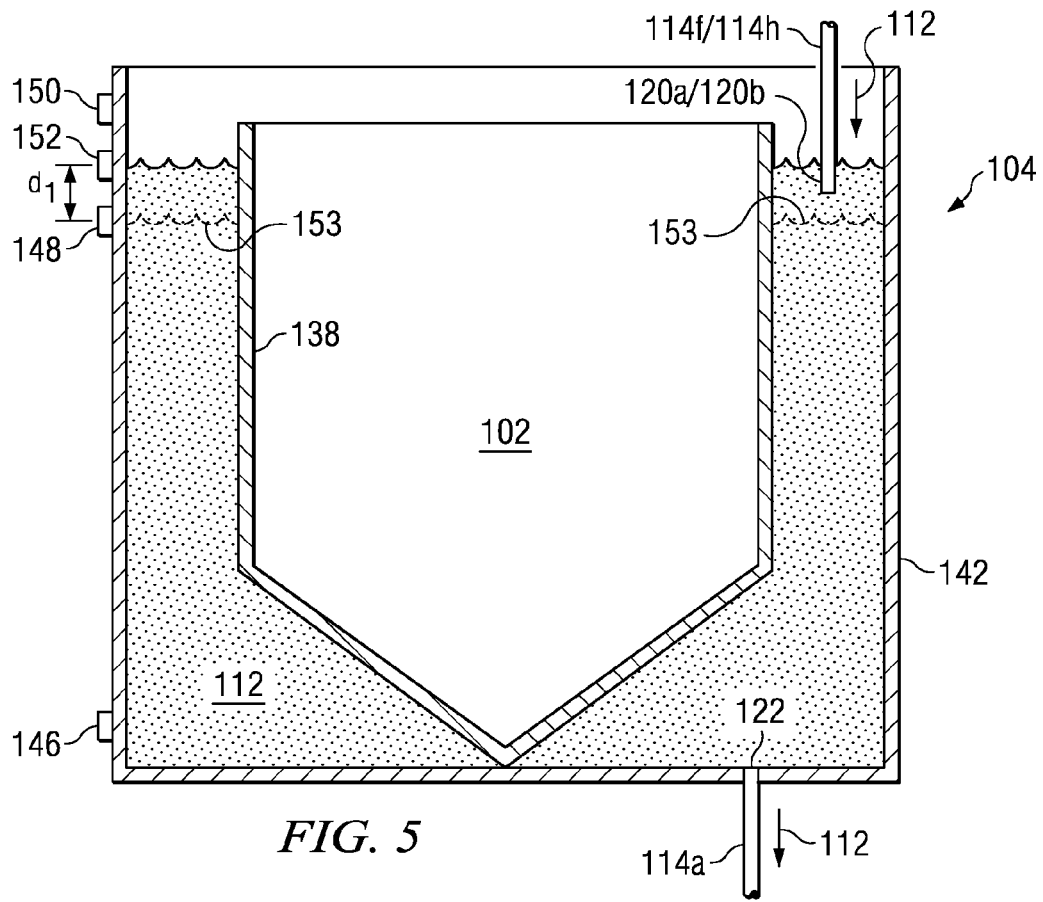
FIG. 5 shows another side view of the fluid container and the weir, illustrating the positioning of fluid level sensors in the weir in accordance with a preferred embodiment of the present invention.

FIG. 5 shows another side view of the fluid container 102 and the weir 104, illustrating the positioning of fluid level sensors 146, 148, 152, 150 on the weir 104 in accordance with a preferred embodiment of the present invention. In accordance with embodiments of the present invention, the level of the fluid 112 is maintained as constant as possible, because large differences in the fluid 112 level in the weir 104 lead to large changes of the fluid 112 surface (e.g., the size of the vertical surface area of the fluid 112 flowing down sidewalls 138 of the container 102) that can lead to higher or lower evaporation of the acid ($H_3PO_4$), causing fluctuations in the concentration levels of the acid (e.g., fluid 136) and also the etch rate. Thus, fluctuations in the acid 136 of the fluid 112 are reduced or eliminated by embodiment of the present invention, resulting in a substantially constant etch rate.

For example, in the embodiment wherein an overfull sensor 152 is included above the full sensor 148, the fluid 112 level is preferably maintained within the level $d_1$ between the overfull sensor 152 and the full sensor 148. The overfull sensor 152 is preferably disposed about 5 cm or less above the full sensor 148 in this embodiment, so that the vertical level of the fluid 112 does not fluctuate by more than about 5 cm during processing of semiconductor devices 110. More preferably, for the vertical level of the fluid 112 does not fluctuate by more than about 1 cm during processing of semiconductor devices 110, as another example. Most preferably, for example, the vertical level of the fluid 112 does not fluctuate or deviate at all during processing of semiconductor devices 110, in some embodiments. In the embodiment wherein an overfull sensor 152 is not included, the level in the weir 104 is preferably maintained at or about the level where the full sensor 148 is positioned, e.g., as shown in phantom at 153.

Figure 6:
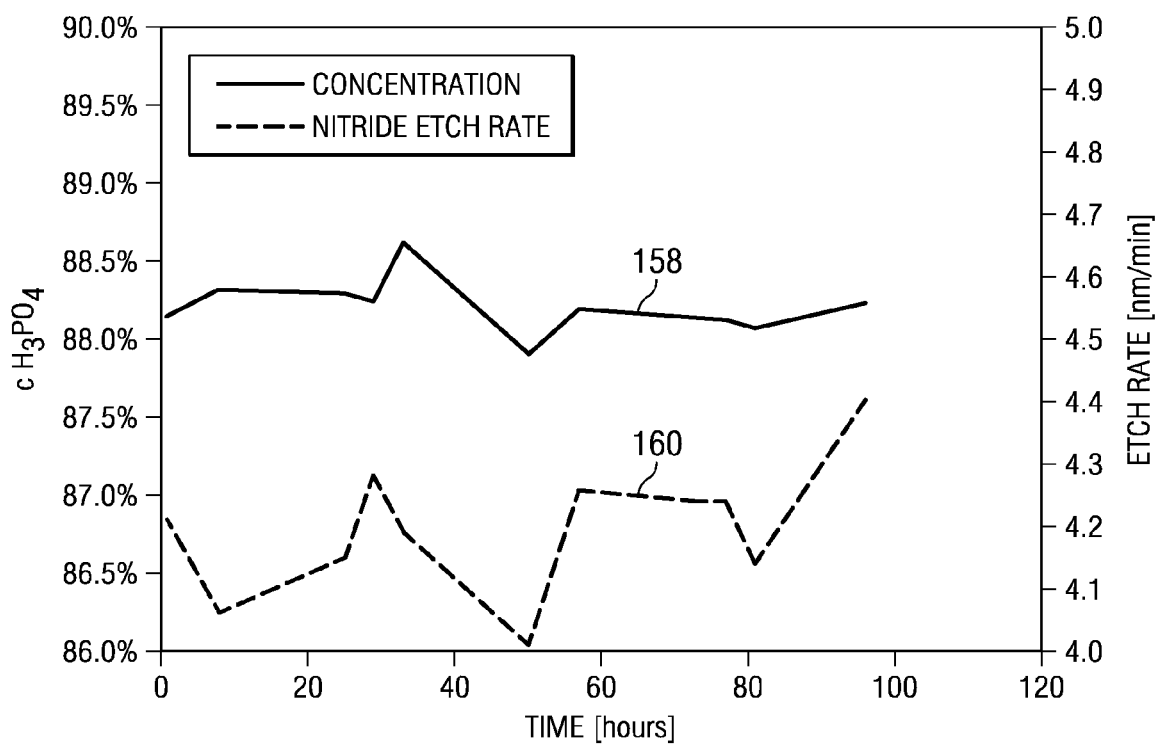
FIG. 6 is a graph showing that substantially constant concentration levels of the fluid achieved by maintaining a relatively constant fluid level in the weir result in a substantially constant etch rate in accordance with a preferred embodiment of the present invention.

FIG. 6 is a graph showing that relatively constant concentration levels of the fluid 112 in the weir 104 are achieved by maintaining a relatively constant fluid 112 level in the weir 104, shown in the graph at 158, resulting in a relatively constant etch rate in accordance with the preferred embodiment of the present invention, as shown in the graph at 160. An example of an etch process using a fluid 112 comprising a solution of $H_3PO_4$ and deionized water to etch a nitride layer of semiconductor devices 110 is shown in FIG. 6. The results shown in FIG. 6 were achieved by draining and refilling the fluid 112, maintaining a substantially constant fluid 112 level within the weir 104 during the etch process. The deionized water "spiking" was also kept constant over the entire time.

Preferably, the concentration of $H_3PO_4$ in the fluid 112 does not change by more than about 0.5%, in accordance with embodiments of the present invention, and more preferably, the concentration of $H_3PO_4$ in the fluid 112 does not change at all over time, for example. Also, preferably, the etch rate for etching material layers of semiconductor devices 110 does not change by more than 0.5 nm or less over time, and more preferably, the etch rate for etching material layers of semiconductor devices 110 does not change at all over time during an etch process, in accordance with embodiments of the present invention, for example.

Embodiments of the present invention also include methods of processing and manufacturing semiconductor devices 110, and semiconductor devices 110 processed and manufactured using the methods and systems 100 described herein.

Figure 7:
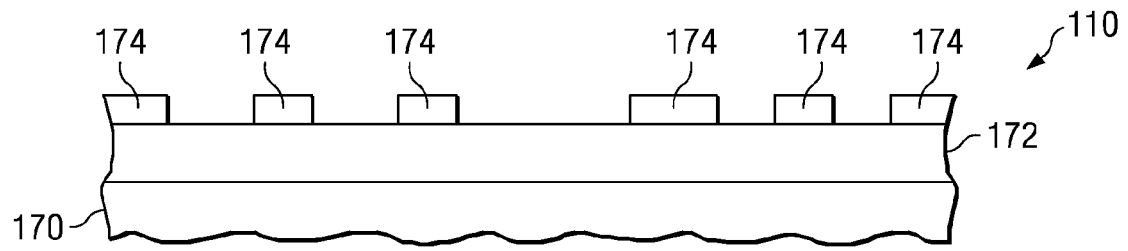
FIG. 7 shows a cross-sectional view of a semiconductor device having a layer of photosensitive material disposed over a material layer to be patterned.
Figure 8:
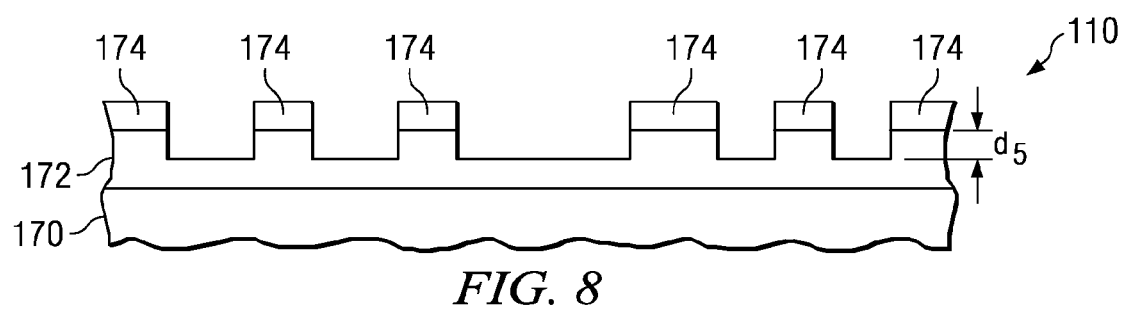
FIG. 8 shows the semiconductor device of FIG. 7 after a portion of the material layer has been etched using the novel processing systems and methods of embodiments of the present invention.

FIG. 7 shows a cross-sectional view of a semiconductor device 110 having a layer of photosensitive material 174 disposed over a material layer 172 to be patterned, and FIG. 8 shows the semiconductor device 110 of FIG. 7 after at least a portion of the material layer 172 has been etched using the novel processing system 100 and methods of embodiments of the present invention.

To manufacture the semiconductor device 110, first, a workpiece 170 is provided. The workpiece 170 may include a semiconductor substrate comprising silicon or other semiconductor materials covered by an insulating layer, for example. The workpiece 170 may also include other active components or circuits, not shown. The workpiece 170 may comprise silicon oxide over single-crystal silicon, for example. The workpiece 170 may include other conductive layers or other semiconductor elements, e.g., transistors, diodes, etc. Compound semiconductors, GaAs, InP, Si/Ge, or SiC, as examples, may be used in place of silicon. The workpiece 170 may comprise a silicon-on-insulator (SOI) substrate, for example.

A material layer 172 is deposited or formed over the workpiece 170. The material layer 172 preferably comprises a nitride material such as silicon nitride or silicon oxynitride ($SiO_xN_y$) in some embodiments, as examples, although the material layer 172 may comprise other materials, such as other insulating materials, conductors, semiconductive materials, or combinations thereof.

A layer of photosensitive material 174 may be deposited over the material layer 172. The layer of photosensitive material 174 may be patterned using lithography, e.g., by exposing the layer of photosensitive material 174 to energy through a lithography mask, and then the layer of photosensitive material 174 is developed, forming a pattern, as shown in FIG. 7.

The semiconductor device 110 may then be placed in the container 102 to be processed or affected by the fluid 112 for a predetermined period of time, for example, as shown in FIG. 1. For example, a portion of the material layer 172 may be removed or etched, to a level $d_5$ below a top surface of the material layer 172, as shown in FIG. 8. Or, the material layer 172 may be etched through its entirety until the top surface of the workpiece 102 is exposed, not shown, to completely pattern the material layer 172. The layer of photosensitive material 174 is then removed, and processing of the semiconductor device 110 is then continued.

Figure 9:
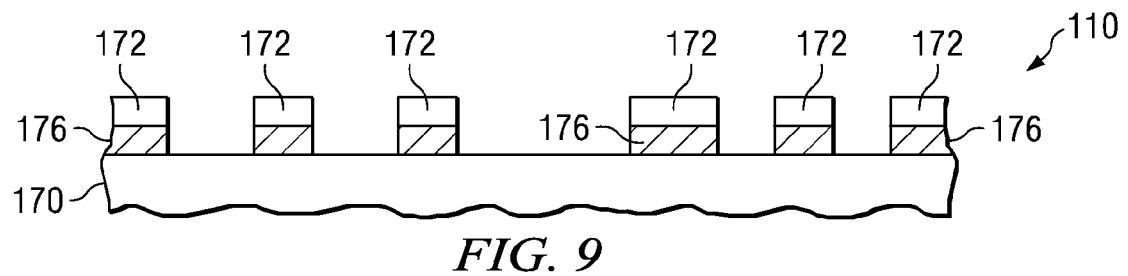
FIG. 9 shows a cross-sectional view of a semiconductor device in accordance with another embodiment of the present invention, wherein a first material layer comprises a hard mask that is used to pattern an underlying second material layer.
Figure 10:
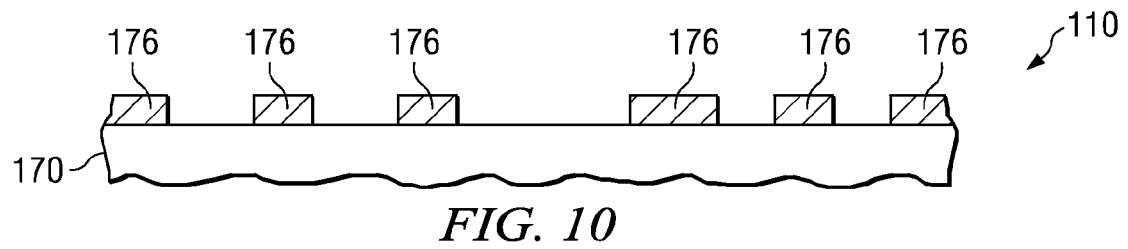
FIG. 10 shows the semiconductor device of FIG. 9 after the hard mask has been removed using the novel processing system and methods of embodiments of the present invention.

FIG. 9 shows a cross-sectional view of a semiconductor device in accordance with another embodiment of the present invention, wherein a first material layer 172 comprises a hard mask, e.g., comprising a nitride material, that is used to pattern an underlying second material layer 176. FIG. 10 shows the semiconductor device of FIG. 9 after the hard mask 172 has been removed using the novel processing system 100 and processing systems of embodiments of the present invention. For example, in a preferred embodiment, the material layer 172 to be affected by the fluid 112 may comprise a nitride material.

In this embodiment, the material layer 172 was used as a sacrificial layer, such as a hard mask or for another purpose. After the workpiece 170 is provided, a second material layer 176 is formed over the workpiece 170 (note that the material layers are not numbered in order of deposition in this embodiment), and the first material layer 172 comprising the hard mask is deposited over the second material layer 176. A layer of photosensitive material 174 is deposited over the first material layer 172 (not shown in FIG. 9; see FIG. 7). The layer of photosensitive material 174 is used as a mask to pattern the hard mask 172. The layer of photosensitive material 174 may be removed or may be left residing over the hard mask 172, not shown.

Then, the nitride material 172 is used as a hard mask to process an underlying second material layer 176, or if the second material layer 176 is not present, the nitride material 172 is used as a mask to process the workpiece 170 (not shown) of the semiconductor device 110. The second material layer 176 or workpiece 170 of the semiconductor device 110 is affected or altered using the patterned nitride material 172 as a hard mask.

For example, affecting or altering the underlying second material layer 176 or the workpiece 170 of the semiconductor device 110 may comprise etching away at least a portion of the underlying second material layer 176 or workpiece 170, as shown in FIG. 10. Alternatively, affecting or altering the underlying second material layer 176 or the workpiece 170 may comprise implanting dopants, impurities, or other substances into the underlying second material layer 176 or workpiece 170; or forming or depositing a material or substance over exposed portions of the underlying second material layer 176 or workpiece 170 (not shown), although other alterations to the underlying second material layer 176 or workpiece 170 may also be performed with the patterned nitride material 172 present.

Next, the semiconductor device 110 is placed in the container 102 with the fluid 112 residing therein, and the first material layer or the nitride material 172, and any photosensitive material 174, if present, is partially or completely removed from over the underlying material layer or the workpiece 170. Thus, in this embodiment, processing the semiconductor device 110 in the novel processing system 100 comprises etching away all of the nitride material layer 172.

Advantageously, the etch rate from lot to lot of semiconductor devices 110 is kept substantially constant, because from lot to lot of processing semiconductor devices 110 using the processing system 100, the fluid 112 level in the weir 104 is maintained at substantially the same level, e.g., either within dimension or range $d_1$, or substantially at level 148, as shown in FIG. 5, in accordance with preferred embodiments of the present invention.

Advantages of embodiments of the present invention include providing systems 100 and methods of stabilizing the etch rate of wet etch processes. The methods may be implemented into the hardware and/or software 154 of existing wet bench tools, for example. Complicated software is not required to implement embodiments of the present invention, and the start up of the tool or processing system 100 may be increased or made faster. Furthermore, the reliability of the processing system 100 and processing systems in a production environment is higher, and more predictable etch times and results are achieved for semiconductor devices 110.

In some embodiments, the need to add deionized water to the fluid 112 during the etch process may be eliminated, by maintaining the fluid 112 level within the weir 104. This results in less complicated software 154 required in the system 100 and simplifies the start up of the processing system 100, for example.

Although embodiments of the present invention and their advantages have been described in detail, it should be understood that various changes, substitutions and alterations can be made herein without departing from the spirit and scope of the invention as defined by the appended claims. For example, it will be readily understood by those skilled in the art that many of the features, functions, processes, and materials described herein may be varied while remaining within the scope of the present invention. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

The invention claimed is:

1. A processing system comprising:
   a first container, the first container being adapted to contain a fluid and a semiconductor device;
   a second container fluidly coupled to the first container, the second container being adapted to receive and retain an overflow amount of a fluid from the first container; and
   a controller, wherein, while the semiconductor device and the fluid are contained within the first container, the controller is adapted to maintain the fluid to a substantially constant level in the second container by
     continuously flowing the fluid on an outer vertical sidewall of the first container thereby forming an evaporative vertical surface during an entire duration that the semiconductor device is contained in the first container, wherein the controller is adapted to maintain the continuous fluid flow by a continuous flow of deionized water into the first container during the entire duration that the semiconductor device is contained in the first container, and
     maintaining a height of the evaporative vertical surface by maintaining the fluid in the second container, wherein the controller is adapted to maintain the height by keeping the fluid between a first lower sensor and a second upper sensor, wherein the first lower and the second upper sensors are placed close to an upper edge of the first container, and wherein the controller is adapted to maintain the evaporative vertical surface is maintained during the entire duration that the semiconductor device is contained in the first container.

2. The processing system according to claim 1, wherein the processing system further comprises at least one heater, at least one pump, at least one thermostat, at least one valve, or at least one filter, coupled to the fluid.

3. The processing system according to claim 1, wherein the controller is configured to maintain the fluid in the second container by adding additional fluid from a fluid supply tank to the first container if the fluid is reduced below the first lower sensor.

4. The processing system according to claim 3, wherein the controller is configured to add the additional fluid to the first or second container until the first lower sensor detects the fluid.

5. The processing system according to claim 3, wherein the controller monitors the second upper sensor disposed in the second container and if the second upper sensor detects the fluid, the controller is configured to remove a portion of the fluid from the second container until the second upper sensor does not detect the fluid.

6. The processing system according to claim 1, wherein the first container comprises a lower region and an upper region, wherein the lower region comprises tapered sidewalls, wherein an overfill sensor, the first lower sensor, and the second upper sensor are disposed on the second container and facing the upper region, and wherein a minimum level sensor is disposed on the second container and facing the lower region.

7. The processing system according to claim 1, wherein the fluid comprises a solution of $H_3PO_4$ and deionized water, and wherein the controller is configured to maintain a continuous flow of $H_3PO_4$ into the first container during the entire duration that the semiconductor device is disposed in the first container.

8. The processing system according to claim 1, wherein a top edge of the outer vertical sidewall of the first container is lower then a top edge of an outer vertical sidewall of the second container.

9. A processing system comprising:
a first container configured to contain a fluid and a semiconductor device;
a weir fluidly coupled to the first container, the first container being disposed within the weir, the weir comprising a second container disposed about a perimeter of the first container that is adapted to receive and retain an overflow amount of the fluid from the first container; and
a controller configured to completely fill the first container and partially fill the weir with the fluid, the controller being configured to continuously flow the fluid on an outer vertical sidewall of the first container into the weir thereby forming an evaporative vertical surface, wherein the controller is adapted to maintain the continuous fluid flow by a continuous flow of deionized water into the first container during the entire duration that the semiconductor device is contained in the first container, wherein the controller is further configured to maintain a height of the evaporative vertical surface formed by the continuous fluid flow during the entire time that the semiconductor device is in the first container.

10. The processing system according to claim 9, wherein the controller is configured to maintain the height by maintaining the fluid in the weir substantially to a level close to a top edge of the first container while the semiconductor device is contained in the first container, and wherein the controller is configured to maintain the fluid in the weir to a vertical distance on a sidewall of the weir over a range of about 5 cm or less.

11. The processing system according to claim 9, wherein the fluid comprises an etching solution configured to etch a material layer of the semiconductor device.

12. The processing system according to claim 9, wherein the fluid comprises a solution of $H_3PO_4$ and deionized water, and wherein the controller is configured to maintain the fluid in the weir by maintaining a predetermined concentration amount of the $H_3PO_4$ in the fluid.

13. The processing system according to claim 12, wherein the controller is further configured to introduce deionized water to the fluid at a constant rate while the semiconductor device is in the first container.

14. The processing system according to claim 9, wherein the first container comprises a lower region and an upper region, wherein the lower region comprises tapered sidewalls, wherein an overfill sensor, a first lower sensor, and a second upper sensor are disposed on the weir and facing the upper region, and wherein a minimum level sensor is disposed on the weir facing the lower region.

15. The processing system according to claim 9, wherein the fluid comprises a solution of $H_3PO_4$ and deionized water, and wherein the controller maintains a continuous flow of $H_3PO_4$ into the first container during the entire duration that the semiconductor device is disposed in the first container.

16. A processing system comprising:
a first container adapted to contain a fluid and a semiconductor device;
a weir fluidly coupled to the first container, the first container being disposed within the weir, the weir comprising a second container disposed about a perimeter of the first container that is adapted to receive and retain an overflow amount of the fluid from the first container, wherein the fluid comprises a solution of $H_3PO_4$ and deionized water; and
a controller configured to completely fill the first container and partially fill the weir with the fluid, wherein the controller is adapted to maintain a continuous flow of $H_3PO_4$ and deionized water into the first container during an entire duration that the semiconductor device is disposed in the first container, wherein the controller is further adapted to maintain a continuous fluid flow on an outer vertical sidewall of the first container into the weir thereby forming an evaporative vertical surface, wherein the controller is adapted to maintain a height of the evaporative vertical surface formed by the continuous fluid flow during the entire duration that the semiconductor device is disposed in the first container.

17. The processing system according to claim 16, wherein the controller is configured to maintain the height by maintaining the fluid in the weir substantially to a level close to a top edge of the first container while the semiconductor device is contained in the first container, and wherein the controller is further adapted to maintain the fluid in the weir to a vertical distance on a sidewall of the weir over a range of about 5 cm or less.

18. An etching system comprising:
a container adapted to support a semiconductor device;
a weir fluidly coupled to the container, the container being disposed within the weir, the weir being disposed about at least a portion of a perimeter of the container, the weir being adapted to receive and retain an overflow amount of an etching fluid from the container;
at least one sensor disposed within the weir, wherein a sensor of the at least one sensors is adapted to monitor a level of the etching fluid within the weir;
means for maintaining a height of an evaporative vertical surface formed by a continuous flow of the etching fluid during an entire duration that the semiconductor device is supported in the container, wherein the means for maintaining height is adapted to maintain the continuous fluid flow by a continuous flow of deionized water into the container during the entire duration that the semiconductor device is contained in the container;
means for obtaining information regarding the level of the etching fluid within the weir from the at least one sensor; and
means for altering the etching fluid level in accordance with the information obtained, maintaining the etching fluid in the weir to a vertical level of a range of about 5 cm or less.

19. The etching system according to claim 18, wherein the at least one sensor comprises a minimum level sensor, an alarm overfill sensor, and/or a full sensor.

20. The etching system according to claim 18, wherein a sensor of the at least one sensors comprises a full sensor adapted to monitor the level of the etching fluid within the weir over the range of about 5 cm or less of a predetermined level.

21. The etching system according to claim 20, further comprising an overfull sensor disposed above the full sensor.

22. The etching system according to claim 18, further comprising a pump adapted to dispose the etching fluid from the weir into the container during an etching process for the semiconductor device.

* * * * *